United States Patent

Kuo

[11] Patent Number: 5,839,907
[45] Date of Patent: Nov. 24, 1998

[54] STRUCTURE OF CARD

[75] Inventor: Cheng Wang Kuo, Taipei Hsien, Taiwan

[73] Assignee: Hon Hai Precision Ind. Co., Ltd., Taipei Hsien, Taiwan

[21] Appl. No.: 794,754

[22] Filed: Feb. 3, 1997

[51] Int. Cl.[6] .................................................. H01R 9/09
[52] U.S. Cl. ........................................................ 439/76.1
[58] Field of Search ............................. 439/76.1, 78, 79, 439/142, 946, 906, 59, 62, 64, 65, 609, 610

[56] References Cited

U.S. PATENT DOCUMENTS

| 5,413,490 | 5/1995 | Tan et al. | 439/76.1 |
| 5,425,657 | 6/1995 | Davis et al. | 439/610 |
| 5,505,628 | 4/1996 | Ramey et al. | 439/76.1 |
| 5,673,181 | 9/1997 | Hsu | 439/76.1 |

Primary Examiner—Gary F. Paumen
Assistant Examiner—Yong Ki Kim

[57] ABSTRACT

An I/O card (10) comprises a frame (12) sandwiched between a top cover (16) and a bottom cover (18) whereby an internal PC board (14) can be protectively embedded within a space defined between the top cover (16) and the bottom cover (18), and seated on the frame with two connectors (25, 29) positioned at two opposite ends for connection to other complementary connectors. Each cover (16, 18) includes coupling devices or hook sections (32) on its periphery for latchable attachment to the peripheral surfaces of the I/O card (10). Each cover (16, 18) further includes plural alignment/reinforcement tabs (60, 62) which are adapted to be received within corresponding alignment slots (56, 58) in the frame (12), respectively, so that the covers (16, 18) can be guidably attached to the frame (12) wherein the tabs (60, 62) of the top cover (16) will not conflict with those of the bottom cover (18) during assembling for alignment consideration, and each pair of tabs (60, 62) of the top cover and the bottom cover, respectively, can be tightly engaged with each other for anti-twisting consideration.

4 Claims, 5 Drawing Sheets

STRUCTURE OF CARD

BACKGROUND OF THE INVENTION

1. Field of the Invention

The invention relates to I/O cards, and particularly to the structure thereof which is easy for assembling and is reliable for efficiently resisting forces imposed thereon to prevent any improper twist thereof.

2. The Prior Art

U.S. Pat. No. 5,413,490 discloses an I/O card having a frame with a pair of top cover and bottom cover attachably snapped thereto, wherein the top cover and the bottom cover are latchably engaged within a slot of the frame on the peripheral surfaces of the card. Because the hook sections of the top cover and the bottom cover are designedly somewhat less dimension for easy attachment to the frame, sometimes it is easy for them to be slidably dropped from the frame if am improper twisting force is applied to the card. The other shortcoming is that such card lacks good guidance device for assembling the top and bottom covers to the frame, thus resulting in the manufacturing problem in mass production.

U.S. Pat. No. 5,409,385 discloses another type I/O card wherein the a deeper slot is formed on the top surface of the frame in place of the one in the peripheral surfaces as shown in the aforementioned U.S. Pat. No. 5,413,490, so that longer extension/hook sections of the top cover and the bottom cover can be received within such slot. Because of the structural relationship of the dimensions of the extension/hook sections of the top cover and the bottom cover, and the slot vertically extending with regard to the frame, this type I/O card has a good character for preventing the extension/hook sections of the top cover and the bottom cover from slidably withdrawal from the frame. While, another problem occurs in such type I/O card is that the downward extension/hook sections of the top cover and the bottom cover may improperly conflict with each other because both of them are assembled to be received within the same vertical slot. This conflict may result in some manufacturing problems during mass production. The invention having the same assignee with the aforementioned two patents, is intended to overcome those disadvantages.

Therefore, an object of the invention is to provide an I/O card structure which is easy for self-assembling and is reinforced for resisting improper twist force which may cause the card deflectably deformed.

SUMMARY OF THE INVENTION

According to an aspect of the invention, an I/O card comprises a frame sandwiched between a top cover and a bottom cover whereby an internal PC board can be protectively embedded within a space defined between the top cover and the bottom cover, and seated on the frame with two connectors positioned at two opposite ends for connection to other complementary connectors. Each cover includes coupling devices or hook sections on its periphery for latchable attachment to the peripheral surfaces of the I/O card. Each cover further includes plural alignment/reinforcement tabs which are adapted to be received within corresponding alignment slots in the frame, respectively, so that the covers can be guidably attached to the frame wherein the tabs of the top cover will not conflict with those of the bottom cover during assembling for alignment consideration, and each pair of tabs of the top cover and the bottom cover can be tightly engaged with each other for anti-twisting consideration.

DETAILED DESCRIPTION OF THE PREFERRED EMBODIMENTS

Figure 1:
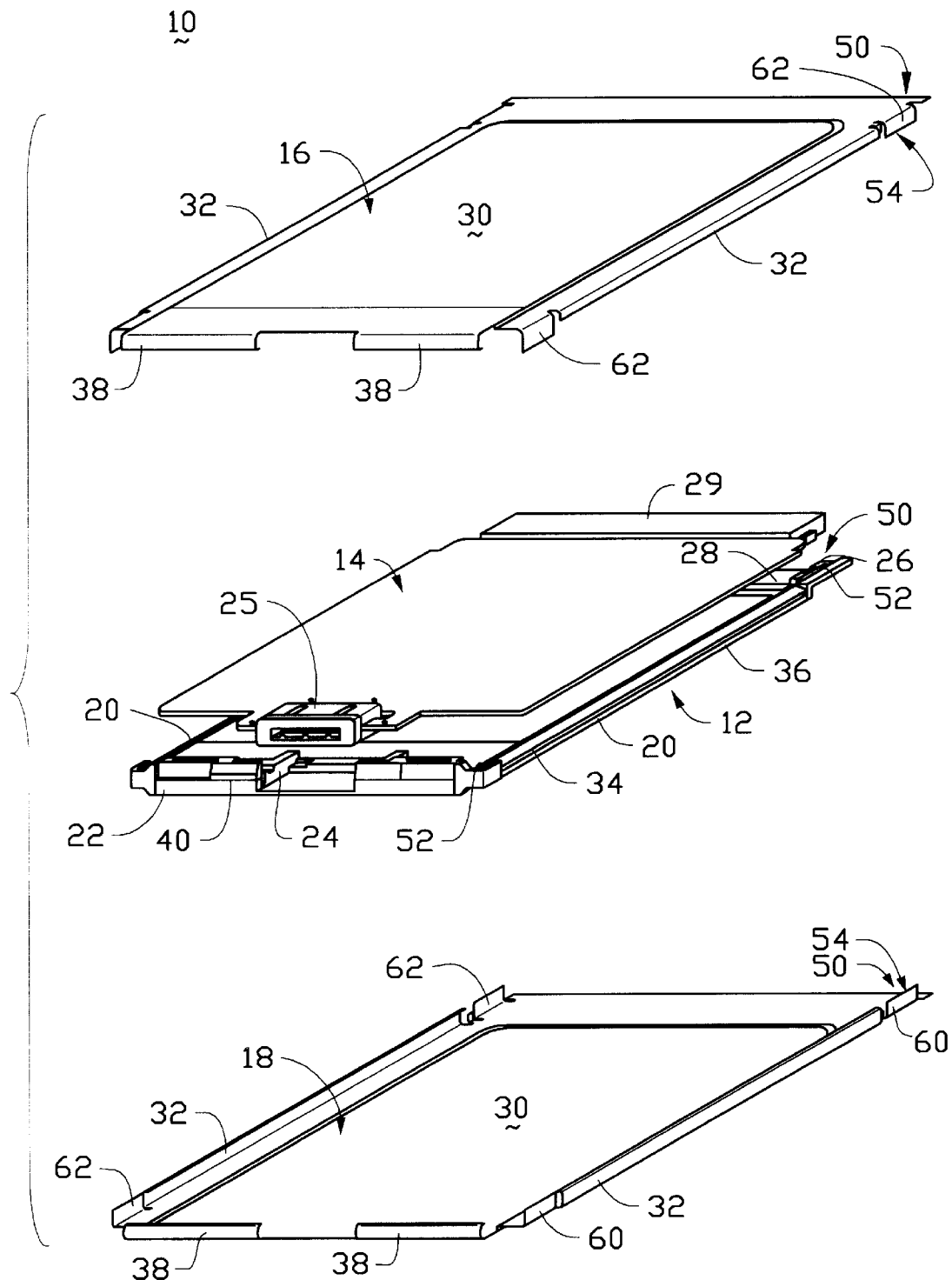
FIG. 1 is an exploded perspective view of a presently preferred embodiment of an I/O card, according to the invention.
Figure 2:
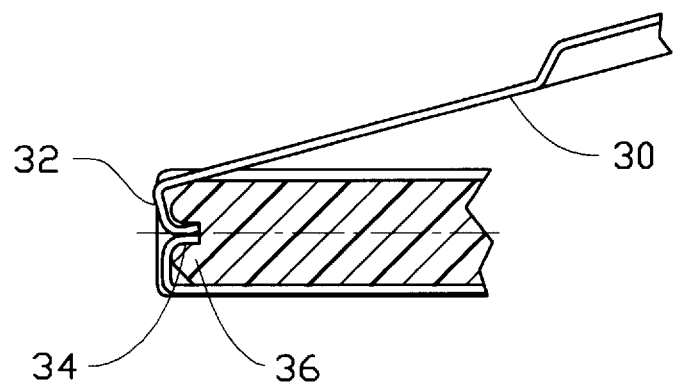
FIG. 2 is a partially cross-sectional view of the I/O card of FIG. 1 to show how the hook sections of the covers latchably cooperate with the slot of the frame.
Figure 3:
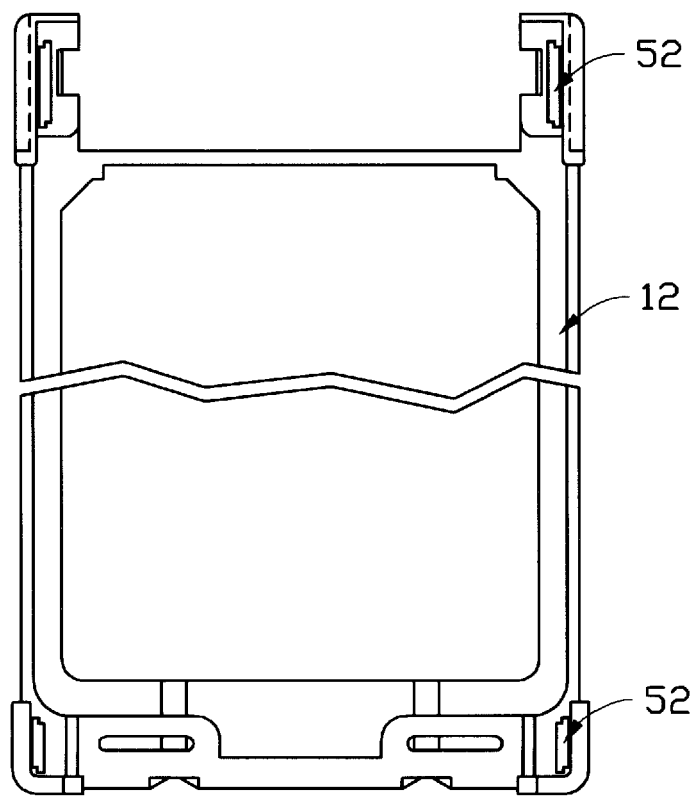
FIG. 3 is a top view of the frame of I/O card of FIG. 1.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is directed to FIGS. 1–5 wherein an I/O card 10 includes a frame 12 having thereon a PC board 14 seated, on which plural electrical components are mounted, and sandwiched between a top cover 16 and a bottom cover 18.

The frame 12 includes two side arms 20, a front support portion 22 defining a first cavity 24 for receiving a first connector 25, and a rear support portion 26 defining a second cavity 28 for receiving a second connector 29 wherein both of first cavity 24 and the second cavity 28 are symmetrical to a lengthwise center line X (FIG. 4) of the I/O card 10, respectively.

The top cover 16 and the bottom cover 18 are structurally same with each other but applied to the frame 12 from two opposite directions. Each cover 16, 18 includes a main base 30 from which a pair of hook sections 32 extending from two side edges for reception within a pair of retention slots 34 extending horizontally and lengthwise along two side walls 36 of the side arms 20. Thus, the top cover 16 and the bottom cover 18 can be latchably assembled to the frame 12. Similarly, each cover 16, 18 further includes hook sections 38 extending from the front edge for reception within the retention slots 40.

The above-mentioned structures are generally disclosed in the aforementioned U.S. Pat. No. 5,413,490. The I/O card 10 of the invention further provides alignment/reinforcement devices 50 including alignment slot means 52 in the frame 12 and alignment tabs 54 extending vertically on the covers 16, 18.

Figure 5:
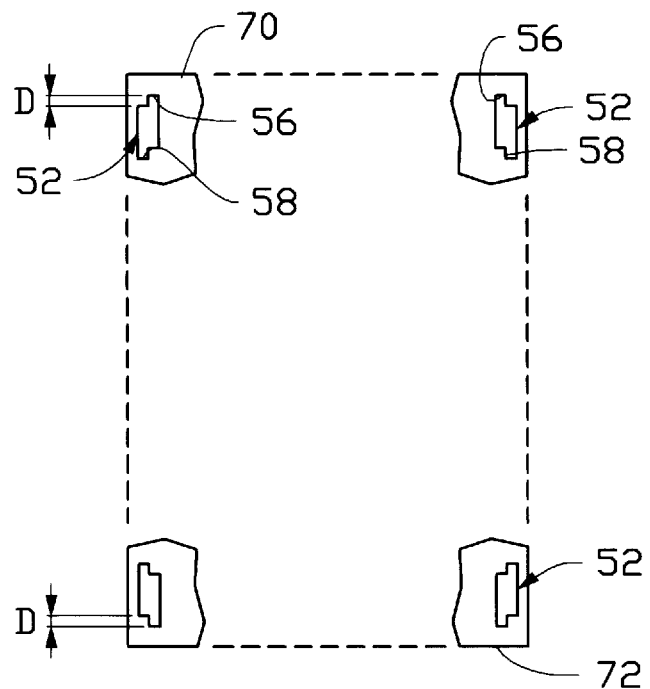
FIG. 5 is a top view of the frame of I/O card of FIG. 1 wherein the alignment slots are somewhat exaggerated in dimension for illustrating how the alignment slots are arranged in the frame.

Referring to FIG. 5, each alignment slot means 52 is positioned around each of our corners of the frame 12 and includes a first inner slot 56 and a second outer slot 58 communicating with each other wherein the inner slot 56 is closer to the center line X of the I/O card than the outer slot 58, and the inner slot 56 is offset from the outer slot 58 with a distance D in the lengthwise direction of the I/O card. In this embodiment, the inner slot 56 of the rear alignment slot means 52 is closer to the rear edge of the I/O card 10 than the outer slot 58 thereof. Similarly and correspondingly, the inner slot 56 of the front alignment slot means 52 is closer to the front edge of the I/O card 10 than the outer slot 58 thereof.

Figure 4:
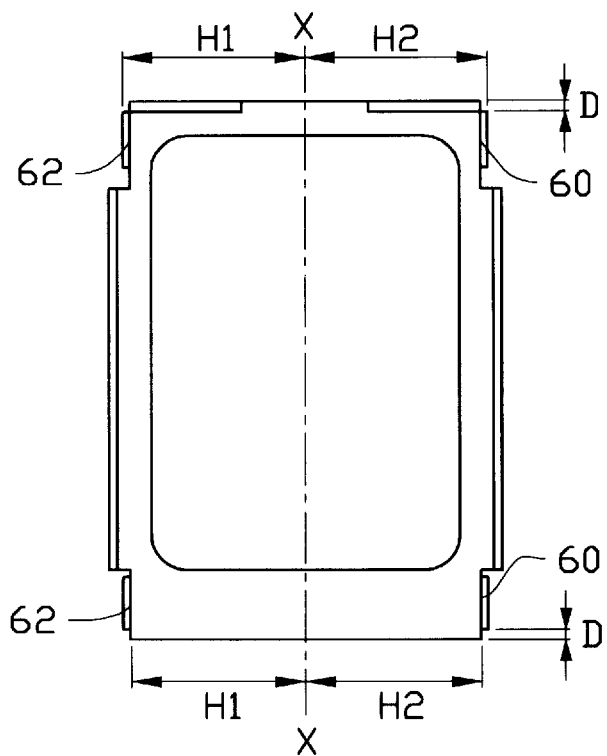
FIG. 4 is a top view of the bottom cover of FIG. 1 to illustrate the structural relationship of the alignment tabs with the cover.

Referring to FIG. 4, to cooperate with such inner and outer slots 56, 58, the alignment tabs 54 of the bottom cover 18 include a first pair of inner alignment tabs 62 extending upward on the left side and a second pair of outer alignment tabs 60 extending upward on the right side wherein distance H1 between the center line X of the I/O card 10 and the inner alignment tab 62 is smaller than distance H2 between the center line X of the I/O card 10 and the outer alignment tab 60, and the difference between distance H1 and distance H2 is generally equal to a thickness of the alignment tab 60, 62 of the cover 18. At the same time, the rear inner alignment tab 62 is closer to the rear edge 72 of the bottom cover 18 than the rear outer alignment tab 60 thereof, and the front inner alignment 62 is closer to the front edge 70 of the bottom cover 18 than the front outer alignment tab 60 thereof, with the same distance D defined by the alignment slot means 52. The top cover 16 has the same structure with the bottom cover 18 and will not be illustrated herewith while the top cover 16 is generally symmetrical to the frame 12 with the bottom cover 18 due to their mutually upside-down relationship.

Therefore, when the bottom cover 18 is assembled to the frame 12 from the bottom, the inner alignment tabs 62 on the left side of the bottom cover 18 are received within the corresponding inner slots 56 on the left side of the frame 12, and the outer alignment tabs 60 on the right side of the bottom cover 18 are received within the corresponding outer slots 58 on the right side of the frame 12. Oppositely and complementary, the top cover 16 can be attached to the frame 12 from the top wherein the inner alignment tabs 62 on the right side of the top cover 16 are received within the corresponding inner slots 56 on the right side of the frame 12, and the outer alignment tabs 60 on the left side of the top cover 16 are received within the corresponding outer slots 58 on the right side of the frame 12. Under this situation, in two alignment slot means 52 on the left side of the I/O card 10, the inner alignment tabs 62 of the bottom cover 18 can engage the corresponding outer alignment tabs 60 of the top cover 16, and in two alignment slot means 52 on the right side of the I/O card 10, the outer alignment tabs 60 of the bottom cover 18 can engage the corresponding inner alignment tabs 62 of the top cover 16. Certainly, the final assembling between the covers 16, 18 and the frame 12 is done through the engagement of the hook sections 32 and 38 of the covers 16, 18 within the retention slots 34, 40 in the frame 10.

It can be noted that the top cover 16 and the bottom cover 18 respectively provides both the inner alignment tabs 62 and outer alignment tabs 60 on two sides of the I/O card 10 for guidance of assembling the top cover 16 and the bottom cover 18 to the frame 12. The arrangement of inner alignment tabs 62 and the outer alignment tabs 60 may avoid any conflict between the top cover 16 and the bottom cover 18. In other words, such conflict may occur between the vertically extending alignment tabs of the top cover and of the bottom cover if no such laterally structural relationship has been defined. Further more, each cover 16 (18) providing the inner alignment tabs 62 on the first side and the outer alignment tabs 60 on second side may cooperate with the complementary outer alignment tabs 60 on the first side and the inner alignment tabs 62 on the second side of the other complementary cover 18 (16). Thus, the top cover 16 and the bottom cover 18 can be made same with each other.

It is noted that because of the offset distance D, the inner alignment slot 56 (or the inner alignment tab 62) and the corresponding outer alignment slot 58 (or the outer alignment tab 60) efficiently distinguish with each other so that the inner alignment tabs 62 and the outer alignment tabs 60 of the covers 16, 18 may be received within the corresponding inner and outer alignment slots 56, 58 in the frame 10 without any obstruction or conflict.

It can be seen that the engagement between the inner alignment tab 62 and the outer alignment tab 60 in the corresponding alignment slot means 52 also provides a good reinforcement function to resist any possible twisting force.

In this embodiment, the alignment slot means 52 extends through vertically, and the inner alignment tab 62 or the outer tab 60 has a height more than half of the thickness of the frame but less than the full thickness of the frame. In comparison with the hook sections 32, 38 which only have generally half of thickness of the frame, the increasingly dimensioned align tabs 60, 62 provide a strong reinforcement for the whole structure of the I/O card 10.

Figure 6:
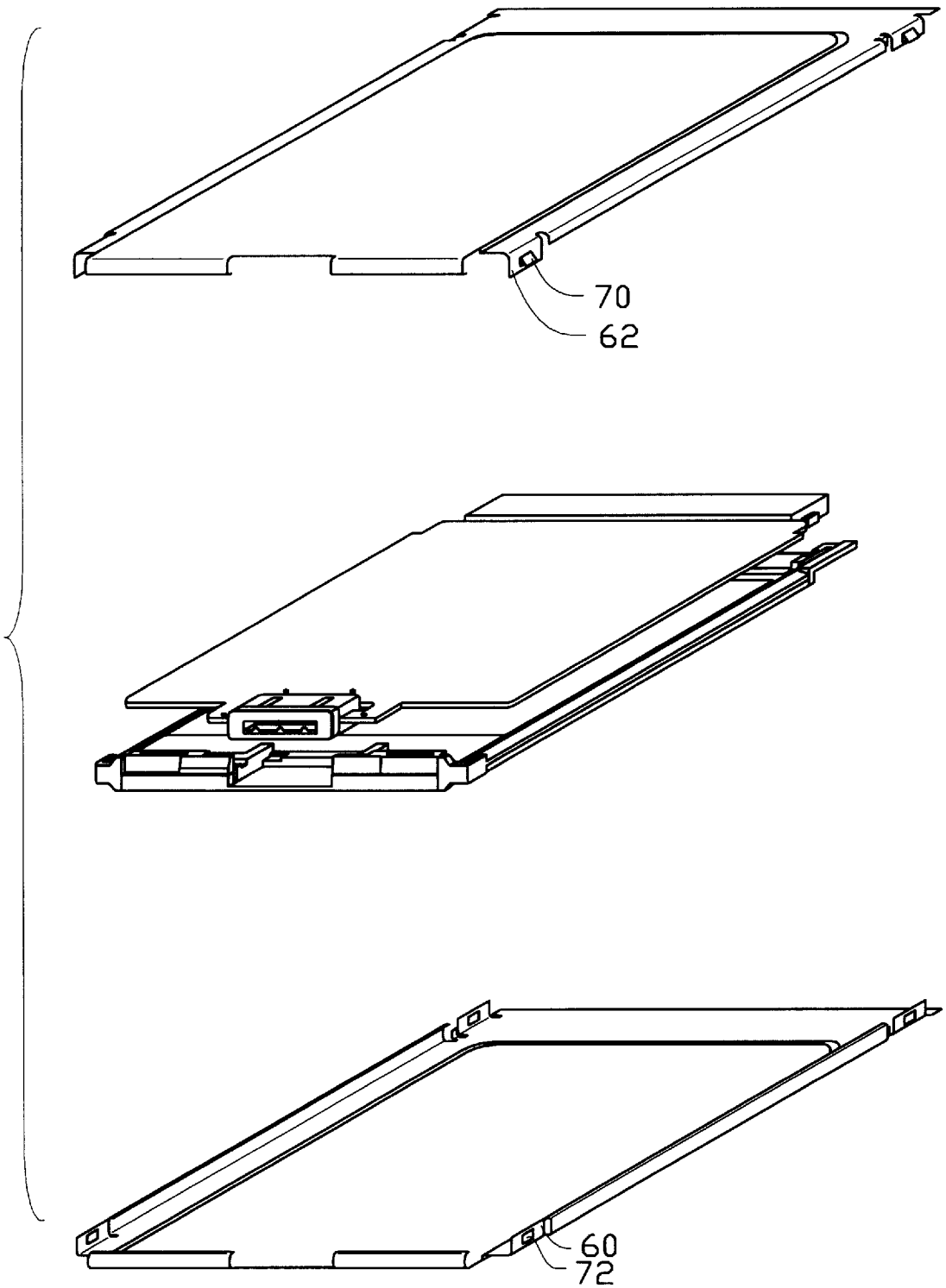
FIG. 6 is an exploded perspective view of another embodiment of an I/O card according to the invention.
Figure 7:
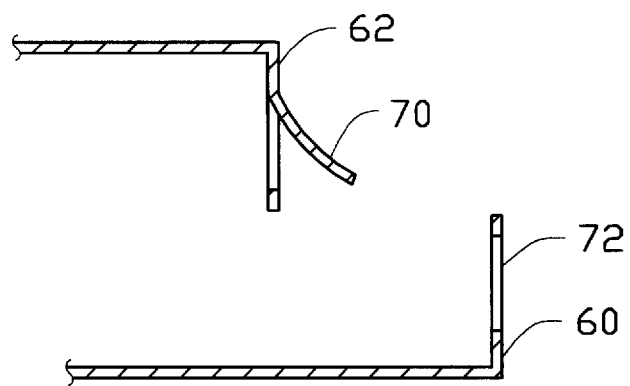
FIG. 7 is a partially cross-sectional view of the alignment tabs of the top cover and the bottom cover of FIG. 6.

FIGS. 6 and 7 show another embodiment of the invention wherein the inner alignment tab 62 has an embossment 70 thereon for reception within an opening 70 in the outer alignment tab 62 so as to form a latching device therebetween, thus resulting in a better combination of the covers 16, 18.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. An I/O card comprising:
    a frame defining at least a cavity;
    a PC board positioned on the frame with at least one connector adapted to be received within said cavity;
    cover means protectively enclosing the frame and the PC board;
    coupling means for fastening the cover means to the frame; and
    at least one guidance/reinforcement device extending vertically with regard to the frame, said guidance/reinforcement device including alignment slot means in the frame and alignment tab means on the cover means, the alignment tab means comprising an inner alignment tab extending from a first cover of said cover means in a first direction into the slot means and an outer alignment tab extending from a second cover of said cover means in a second direction into the slot means, said second direction being opposite to the first direction, said inner alignment tab being closer to a center line of the I/O card than the outer tab.

2. The I/O card as defined in claim 1, wherein said guidance/reinforcement device is separated from the coupling means.

3. The I/O card as defined in claim 1, wherein the alignment slot means comprises one inner alignment slot and one outer alignment slot communicating with each other but with an offset therebetween in a lengthwise direction.

4. A frame for use within an I/O card comprising:
   two side arms;
   a front portion positioned between said two side arms and defining a cavity therebetween; and
   at least an alignment slot means extending vertically with regard to the frame wherein said alignment slot means includes generally side by side an inner alignment slot and an adjacent outer alignment slot communicative with each other, and wherein said inner alignment slot is closer to a center line of said I/O card than said outer alignment slot and an offset is formed in a lengthwise direction between said inner alignment slot and said outer alignment slot.

* * * * *